United States Patent
Lehner

(10) Patent No.: US 6,906,428 B2
(45) Date of Patent: Jun. 14, 2005

(54) ELECTRONIC COMPONENT HAVING A SEMICONDUCTOR CHIP AND METHOD FOR POPULATING A CIRCUIT CARRIER DURING THE PRODUCTION OF THE ELECTRONIC COMPONENT

(75) Inventor: Rudolf Lehner, Laaber (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/698,081

(22) Filed: Oct. 30, 2003

(65) Prior Publication Data

US 2004/0089935 A1 May 13, 2004

(30) Foreign Application Priority Data

Oct. 30, 2002 (DE) .......................................... 102 50 778

(51) Int. Cl.[7] ............................................. H01L 23/48
(52) U.S. Cl. ...................... 257/778; 257/783; 257/775; 438/108; 438/118; 438/119
(58) Field of Search ................................ 257/783, 778, 257/775; 438/106, 107, 108, 118, 119

(56) References Cited

U.S. PATENT DOCUMENTS

| | | |
|---|---|---|
| 5,270,260 A | 12/1993 | Scheuenpflug |
| 5,353,498 A * | 10/1994 | Fillion et al. .................. 29/840 |
| 5,394,490 A * | 2/1995 | Kato et al. ...................... 385/14 |
| 5,804,882 A | 9/1998 | Tsukagoshi et al. |
| 5,834,848 A * | 11/1998 | Iwasaki ...................... 257/778 |
| 5,953,592 A * | 9/1999 | Taniguchi et al. .......... 438/118 |
| 5,966,903 A | 10/1999 | Dudderar et al. |
| 6,130,472 A * | 10/2000 | Feger et al. ................. 257/643 |
| 6,181,015 B1 * | 1/2001 | Gotoh et al. ................. 257/778 |
| 6,205,745 B1 | 3/2001 | Dudderar et al. |
| 6,441,500 B1 | 8/2002 | Sumikawa et al. |
| 6,455,786 B1 * | 9/2002 | Horiuchi et al. ............. 174/260 |
| 2002/0158343 A1 * | 10/2002 | Ogino et al. ................. 257/784 |
| 2003/0085474 A1 | 5/2003 | Frankowsky et al. |

FOREIGN PATENT DOCUMENTS

| | | |
|---|---|---|
| AT | 406 537 B | 6/2000 |
| DE | 198 22 512 A1 | 10/1999 |
| DE | 101 45 468 C1 | 1/2003 |
| EP | 0 962 960 A2 | 12/1999 |
| EP | 1 032 030 A2 | 8/2000 |
| JP | 57031148 A | 2/1982 |
| JP | 03046242 A | 2/1991 |
| JP | 06 196 518 A | 7/1994 |
| JP | 2000269239 A | 9/2000 |
| WO | 96/37913 | 11/1996 |
| WO | WO 00/412340 * | 7/2000 ........... H01L/21/56 |

OTHER PUBLICATIONS

Theuβ, H. et al.: "Mounting Process for Semiconductor Dice", Siemens Technik Report, 2001, pp. 1–2.

* cited by examiner

Primary Examiner—Jasmine Clark
(74) Attorney, Agent, or Firm—Laurence A. Greenberg; Werner H. Stemer; Ralph E. Locher

(57) ABSTRACT

An electronic component and a method for populating a circuit carrier during the production of the electronic component includes providing the semiconductor chip with at least one buffer body on its active top side, which buffer body, during the populating method, protects the semiconductor component structures—disposed under the buffer body—of the active top side of the semiconductor chip against mechanical damage and has a protective layer of a mechanically damping material.

25 Claims, 5 Drawing Sheets

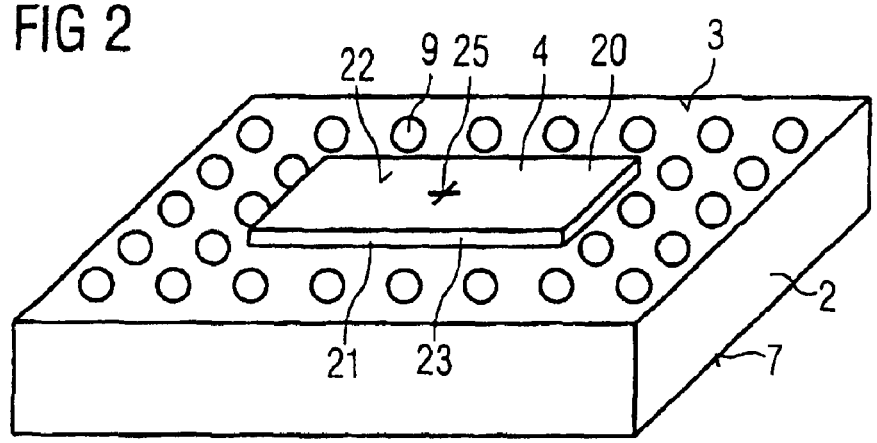
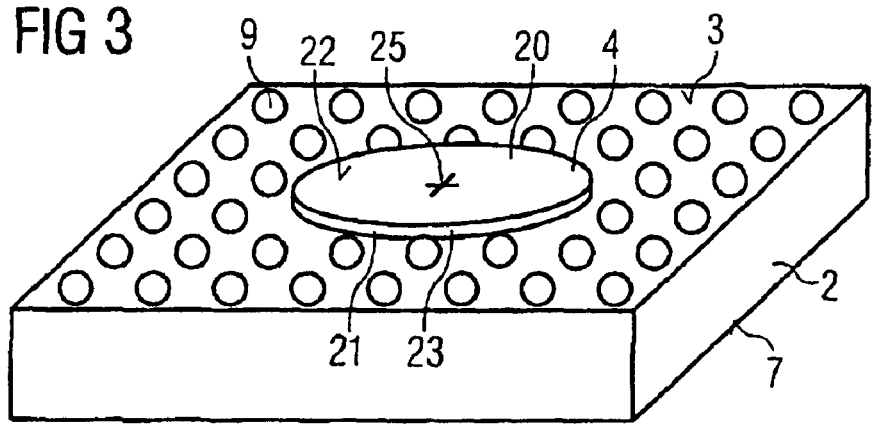
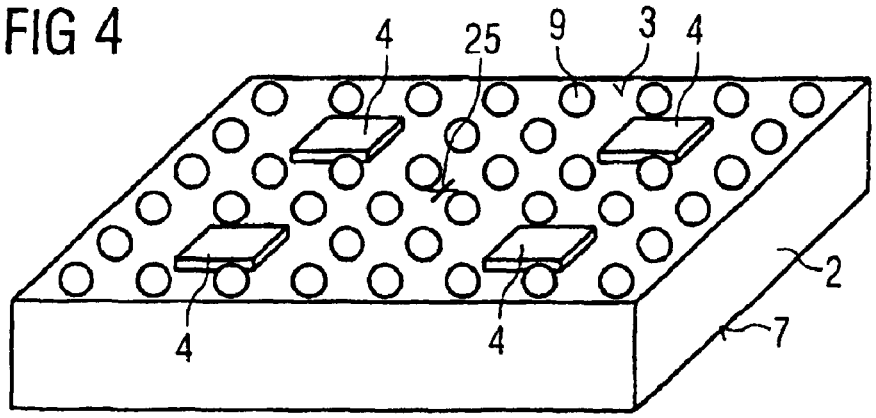

ELECTRONIC COMPONENT HAVING A SEMICONDUCTOR CHIP AND METHOD FOR POPULATING A CIRCUIT CARRIER DURING THE PRODUCTION OF THE ELECTRONIC COMPONENT

BACKGROUND OF THE INVENTION

Field of the Invention

The invention relates to an electronic component having a semiconductor chip, which has a buffer body, and a method for populating a circuit carrier during the production of the electronic component with turning and lift-off of the semiconductor chip from a film.

German Patent 101 45 468 C1, corresponding to U.S. Patent Publication No. 2003/085,474 to Frankowsky et al., discloses a semiconductor chip that has at least one buffer body on its active top side, which buffer body is disposed between the contact areas and has at least one protective layer for semiconductor component structures—disposed below the buffer body—of the active top side of the semiconductor chip, in which the protective layer has a mechanically damping material. Furthermore, U.S. Pat. No. 6,441,500 to Sumikawa et al. discloses disposing hard parts with low elastic moduli on the active side of a wafer between contact areas.

Next, International publication WO 96/37913, corresponding to U.S. Pat. No. 5,804,882 to Tsukagoshi et al., discloses disposing spacer elements on an insulating layer on the active surface of a chip in order to have a favorable influence on the flow of adhesive. In such a case, the insulating layer shown there may include silicon nitride, silicon oxide, or polyimides.

JP 2000-269239 to Furuhata discloses forming buffer pieces referred to as "Damibamp" on the active side of a chip between the contacts, which buffer pieces prevent damage to the chip in the event of suction with a flat placement head.

European Patent Application 0962960 A2, corresponding to U.S. Pat. Nos. 6,205,745 and 5,966,903 to Dudderar et al., discloses a method for producing a plurality of electronic components with semiconductor chips, which have buffer bodies on their active top sides. Similar methods are disclosed in German Published, Non-Prosecuted Patent Application DE 198 22 512 A1 and Japanese Patent document 03-46242 A.

The production of electronic components with a circuit carrier being populated with semiconductor chips having semiconductor chip contacts proves to be relatively critical and, in some instances, does not yield the desired results, especially if the semiconductor chip contacts are present as flip-chip contacts in the form of contact balls, contact bumps, or area contacts.

SUMMARY OF THE INVENTION

It is accordingly an object of the invention to provide an electronic component having a semiconductor chip and method for populating a circuit carrier during the production of the electronic component that overcome the hereinaforementioned disadvantages of the heretofore-known devices and methods of this general type and that improves the process for producing electronic components with a circuit carrier being populated with semiconductor chips and specifies improved electronic components.

With the foregoing and other objects in view, there is provided, in accordance with the invention, a semiconductor chip, including an active top side, semiconductor component structures and contact areas disposed on the active top side, a buffer having a protective layer of a mechanically damping material, the protective layer having a free surface, the buffer being disposed between the contact areas and above the semiconductor component structures and having a hard or mechanically protective coating at the free surface of the protective layer.

The invention provides a method for populating a circuit carrier with semiconductor chips with turning and lift-off of the semiconductor chips. To that end, an active top side has at least one buffer body in addition to its semiconductor component structures.

Firstly, a first transport film populated with semiconductor chips is provided, the semiconductor chips being disposed with their passive rear sides on an adhesive top side of the first transport film. Afterward, a second transport film is provided on semiconductor chip contacts of the active top side of the semiconductor chips. The adhesive strength of the second transport film is greater than the adhesive strength of the adhesive top side of the first transport film so that the mechanical bonding of the semiconductor chip contacts to the second transport film is greater than the mechanical bonding of the rear sides of the semiconductor chips to the first transport film. The first transport film is, subsequently, removed from the passive rear sides of the semiconductor chips.

The semiconductor chips are, then, fixed on the second transport film by their semiconductor chip contacts. The semiconductor chips on the second transport film can, then, be supplied to a circuit carrier populating device. In such a circuit carrier populating device, the semiconductor chips are, then, successively lifted off from the second transport film at a lift-off position by one or more piercing tools. In such a case, the piercing tools penetrate through the second transport film and lift off the semiconductor chip through pressure on the buffer body provided by the tip of the piercing tools. Afterward, the semiconductor chips are moved from the lift-off position into a placement position. In the placement position, the semiconductor chip contacts are deposited onto corresponding contact pads of a circuit carrier and subsequently connected to the contact pads.

Such a method has the advantage that exclusively adhesive transport films are used for turning the semiconductor chips and, consequently, the semiconductor chips are turned in a gentle fashion. Finally, however, the semiconductor chips have to be lifted off from the second transport film, which is used for the turning maneuver. During such an operation, the buffer body on each semiconductor chip protects the semiconductor component structures disposed underneath against damage. Consequently, the populating method of the present invention can be carried out reliably, in particular, during the lift-off operation. Furthermore, the risk of damage to the sensitive semiconductor component structures on the active top side of the semiconductor chip is reduced. This advantageously increases productivity and improves the reliability in the placement phase during the production of an electronic component. A prerequisite for the improvement is that corresponding buffer bodies are provided according to the invention on the active top sides of the semiconductor chips. Such buffer bodies prevent the active top side of the semiconductor chip from being scratched by piercing tools or lifting tools.

For the provision of the first transport film, it is advantageously possible to adhesively bond an undivided semiconductor wafer onto a single-sided adhesive wafer film by its passive rear side and, then, to separate the semiconductor wafer to form semiconductor chips on the wafer film. The wafer film, which initially serves to hold the semiconductor chips in position during the separating operation, can, thus, subsequently serve as the first transport film. For turning the semiconductor chips, a second transport film of the size of the semiconductor wafer can, then, be applied to the flip-chip contacts of the active top side of the semiconductor chips of a separated semiconductor wafer. The original wafer film can, then, be stripped away from the passive rear side of the semiconductor wafer. After turning, the semiconductor chips on the second transport film can be supplied to an automatic circuit carrier populating machine in order to position the semiconductor chips individually on the circuit carrier.

In accordance with another feature of the invention, the buffer has the coating in areas.

With the objects of the invention in view, there is also provided a semiconductor wafer, including a plurality of semiconductor chips disposed in rows and columns, each of the semiconductor chips having an active top side, semiconductor component structures and contact areas disposed on the active top side, a buffer having a protective layer of a mechanically damping material, the protective layer having a free surface, the buffer being disposed between the contact areas and above the semiconductor component structures and having a hard or mechanically protective coating at the free surface of the protective layer.

With the objects of the invention in view, there is also provided a method for producing a semiconductor wafer, including the steps of disposing semiconductor component structures and contact areas in rows and columns on an active top side of a semiconductor chip, providing a buffer with a protective layer of a mechanically damping material and with a protective layer having a hard or mechanically protective coating, and applying the buffer between the contact areas and to the semiconductor component structures.

With the objects of the invention in view, there is also provided a method for producing a semiconductor chip, including the steps of disposing semiconductor component structures and contact areas on an active top side of the semiconductor chip, providing a buffer with a protective layer of a mechanically damping material and with a protective layer having a hard or mechanically protective coating and applying the buffer between the contact areas and above the semiconductor component structures.

In accordance with a further mode of the invention, the application step is carried out by applying a layer of a mechanically damping material, in particular, a plastic layer, and subsequently patterning the damping material layer to form buffer bodies in semiconductor chip positions by photolithography and etching or laser removal.

In accordance with an added mode of the invention, the step of applying the buffer bodies in the semiconductor chip positions is carried out by printing the damping material layer thereon by jet printing technology, screen printing technology, or mask printing technology.

In accordance with an additional mode of the invention, the applying step is carried out by applying a multilayer coating to the semiconductor wafer and subsequently patterning the coating to form buffer bodies.

With the objects of the invention in view, there is also provided a method for mounting on supports, including the steps of providing semiconductor chips with active top sides and passive rear sides, disposing semiconductor component structures and contact areas on the active top sides, providing a buffer with a protective layer of a mechanically damping material, the protective layer having a free surface, and with a hard coating at the free surface of the protective layer, disposing the buffer between the contact areas and above the semiconductor component structures, mounting the semiconductor chips on circuit carriers by providing a first transport film with an adhesive top side having a given adhesive strength, adhesively bonding the semiconductor chips by their passive rear sides on the adhesive top side, providing a second transport film with an adhesive strength greater than the given adhesive strength, applying the second transport film to the active top side of the semiconductor chips, removing the first transport film from the passive rear sides of the semiconductor chips, supplying the semiconductor chips on the second transport film to a circuit carrier populating device, successively lifting off the semiconductor chips from the second transport film in the populating device at a lift-off position by at least one piercing tool penetrating through the second transport film and acting on the buffer disposed on the semiconductor chip, and positioning the semiconductor chips with the semiconductor chip contacts onto corresponding contact pads of the circuit carrier.

In accordance with yet another mode of the invention, the first transport film is turned with the semiconductor chips through 180° before applying the second transport film.

In accordance with yet a further mode of the invention, a composite including the first transport film, the second transport film, and the semiconductor chips disposed between the first and second transport films is turned through 180° before removing the first transport film from the passive rear sides of the semiconductor chips.

A first transport film may also be provided by positioning semiconductor chips in rows and columns on the adhesive top side of a first transport film by their passive rear sides. In such a case, too, the semiconductor chips are turned by virtue of applying a second transport film to the semiconductor chip contacts of the semiconductor chips of the first transport film and this composite including two transport films and the semiconductor chip disposed in between subsequently being turned through 180°. Afterward, the first transport film can, then, again be stripped away from the passive rear sides of the semiconductor chips to supply the semiconductor chips on the second transport film to an automatic circuit carrier populating machine in a suitable orientation.

In an alternative possibility for carrying out the method according to the invention, it is provided that, before the second transport film is actually applied, the first transport film with the semiconductor chips is turned through 180° and only then are the semiconductor chips adhesively bonded onto a second transport film with their flip-chip contacts. Afterward, the first transport film is stripped away from the passive rear sides of the semiconductor chips.

When carrying out the method, after a semiconductor chip has been lifted off from the second transport film with the aid of the piercing tool, the passive rear side of the semiconductor chip may be gripped by a vacuum forceps and supplied to a placement position. The vacuum forceps can, then, be lowered in this placement position so that the flip-chip contacts on the active top side of the semiconductor chip can be applied to correspondingly disposed contact pads of a circuit carrier.

Such a procedure has the advantage that the vacuum forceps only grips the passive rear side of the semiconductor chip and, consequently, does not touch the semiconductor component structures on the active top side of the semiconductor chip.

Consequently, the active top side of the semiconductor chip is protected against engagement and damage due to the vacuum forceps. Because, on the other hand, the buffer body ensures that no piercing tools can damage the semiconductor component structures on the active top side of the semiconductor chip, both the active front side and the passive rear side are protected against mechanical damage with such a variant.

For application of a second transport film, in addition to being applied by adhesive bonding, the second transport film can also be rolled, placed, pressed, or laminated onto the external contacts of the semiconductor chips. These techniques make different requirements of the material of the second transport film. For rolling on or pressing on the second transport film, the second transport film has a pressure-sensitive adhesive layer. For lamination after placing the second transport film onto the semiconductor chip contacts, the second transport film has a thermoplastic as a coating. Such thermoplastic softens at elevated temperature and enables the lamination.

A method for producing a plurality of electronic components with semiconductor chips, which have buffer bodies on their active top side, has the method steps described below. Firstly, a semiconductor wafer with a plurality of semiconductor chip positions is provided. The semiconductor chip positions have semiconductor component structures on the active top side of the semiconductor wafer. For their part, the semiconductor component structures have electrodes. The electrodes are connected to contact areas on the active top side of the semiconductor wafer, the contact areas being uncovered and access to the contact areas being possible.

The active top side of the semiconductor wafer has applied to it, in the semiconductor chip positions, at least one buffer body between the contact areas. The contact areas may, subsequently, be covered with semiconductor chip contacts. Such semiconductor chip contacts are also referred to as flip-chip contacts, which may be present in the form of solder balls, solder bumps, or area contacts. Afterward, the semiconductor wafer is separated into semiconductor chips and the semiconductor chips are applied to a first transport film. The transport film may perfectly well be a wafer film to which the entire semiconductor wafer is firstly applied and then separated to form semiconductor chips. Afterward, the method steps for populating a circuit carrier as presented above are carried out, the semiconductor chips being turned through 180° with the aid of a second transport film. Once a circuit carrier has been populated, the semiconductor chips are packaged in a plastic housing to form electronic components on the circuit carrier with the formation of a panel. The panel can, finally, be separated into individual electronic components.

Such a method has the advantage that, as early as in the so-called front-end region of a production line, precautions are taken to improve and accelerate the production of electronic components in the back-end region of the production line. This is because the buffer bodies make it possible to run a higher cycle frequency in the automatic populating machine. Moreover, the risk of damage to the semiconductor chip element structures such as interconnects during processing in a placement installation is reduced. The method according to the invention provides for one or more buffer bodies to be applied in each semiconductor chip position as early as at the wafer level, the buffer body ensuring reliable ejection and raising of semiconductor chips in a lift-off position of an automatic populating machine. To that end, a piercing tool is oriented toward the buffer body in the lift-off position so that the piercing tool cannot damage the remaining active top side of the semiconductor chip. In addition to this preventive protective measure by application of a buffer body, turning of the semiconductor chips in the automatic populating machine is, additionally, obviated because the turning is effected simultaneously and jointly in large numbers with the aid of the first and second transport films prior to supply to the automatic populating machine.

For application of the buffer body, firstly, the semiconductor wafer or the semiconductor chip is coated with a layer made of mechanically damping material, preferably, a plastic layer. The layer is patterned subsequently to form buffer bodies in the semiconductor chip positions by photolithography methods and etching methods or by laser removal methods. To that end, the material for the buffer body may be applied to the semiconductor wafer by casting, vapor deposition, sputtering, or spin-on, to be precise, simultaneously for all the semiconductor chips. The subsequent patterning of the applied plastic layer by photolithography methods has the advantage that the material of the buffer body can be disposed precisely between the contact areas in each semiconductor chip position of the semiconductor wafer.

Another method for applying the buffer bodies to the semiconductor wafer in the semiconductor chip positions lies in printing the buffer bodies being on in already patterned form by jet printing technology, screen printing technology, or mask printing technology. Such printing technology makes it possible to apply material only where a buffer body is intended to be formed on the semiconductor wafer.

Furthermore, multi-layer coatings for producing a buffer body may also be applied to the semiconductor wafer. In particular, it is advantageous to deposit a hard metal layer, preferably, its chromium-nickel alloy, on the buffer bodies to improve the surface hardness of the buffer bodies and to achieve a higher mechanical resistance to the piercing tool during the lift-off of the semiconductor chips. Instead of a hard metal layer, the buffer bodies may also be covered with an oxide-ceramic or nitride-ceramic layer, which has the advantage over a covering with a hard metal layer that these protective layers are electrically nonconductive and, consequently, the risk of triggering short circuits between contact areas is reduced.

A further aspect of the invention lies in providing an electronic component having a semiconductor chip, the semiconductor chip having at least one buffer body on its active top side. The advantages of such a buffer body are manifested particularly when populating circuit carriers with the semiconductor chips and improve the yield in the production of electronic components. Such a buffer body is disposed between the contact areas on the active top side of the semiconductor chip. It forms a protective layer for the semiconductor component structures disposed below the buffer body.

The buffer body has a mechanically damping material that provides for damping of the mechanical impulse of the piercing tool that occurs during the raising or lift-off of semiconductor chips from transport films in an automatic populating machine and increases as the cycle frequency increases. Such a material may be a thermoplastic or a thermosetting plastic, plastics being preferred if they have a high insulation resistance. The surface of the plastic material of the buffer body may be improved by a hard metal, preferably, a chromium-nickel alloy, or by an oxide ceramic or by a nitride ceramic.

The buffer body may substantially have a circular or angular contour with a diameter or, respectively, an edge length of between 50 and 500 micrometers given a thickness of between 2 and 50 micrometers. The thickness depends on the rounding-off radius of the tip of the piercing tool. The thickness of the buffer body can be reduced as the rounding radius of the tip increases to achieve the same protective effect. The outer contour of the buffer body, whether circular or angular, depends on the configuration of the contact areas on the active top side of the respective semiconductor chip. Instead of a single buffer body, a plurality of buffer bodies may also be disposed in distributed fashion between the contact areas on the active top side of the semiconductor chip. In such a case, an individual buffer body is disposed in the region of the centroid of the semiconductor chip and a plurality of buffer bodies are disposed uniformly around a centroid region of the semiconductor chip. Here, too, the number of buffer bodies depends on the forces to be applied during the lift-off of a semiconductor chip from a second transport film. The larger the lift-off forces to be applied, the greater the number of piercing tools to be provided and, thus, the number of buffer bodies required on the active top side of the semiconductor chips to avoid microcracks in the semiconductor chip.

In addition to the electronic components according to the invention, the semiconductor wafers according to the invention are also an important commercial product. Such wafers according to the invention have semiconductor chips disposed in rows and columns, the semiconductor chips for their part having at least one buffer body that is provided for a method according to the invention for producing an electronic component.

To summarize, it can be stated that, with the present invention, mechanical damage to the electrically active chip surface by a piercing tool in an automatic populating machine is avoided, and a high throughput becomes possible for the flip-chip process. This is achieved by the buffer body according to the invention on the active top side of a semiconductor chip. Consequently, the introduction of a buffer body in the front end region of the production of electronic components provides a structure that protects the semiconductor chip against mechanical damage in the back end process, in particular, against damage due to the piercing-out tools.

Other features that are considered as characteristic for the invention are set forth in the appended claims.

Although the invention is illustrated and described herein as embodied in an electronic component having a semiconductor chip and method for populating a circuit carrier during the production of the electronic component, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is a fragmentary, perspective view of the semiconductor chip of FIG. 1;

FIG. 3 is a fragmentary, perspective view of a second embodiment of a semiconductor chip according to the invention;

FIG. 4 is a fragmentary, perspective view of a third embodiment of a semiconductor chip according to the invention;

DESCRIPTION OF THE PREFERRED EMBODIMENTS

Figure 1:
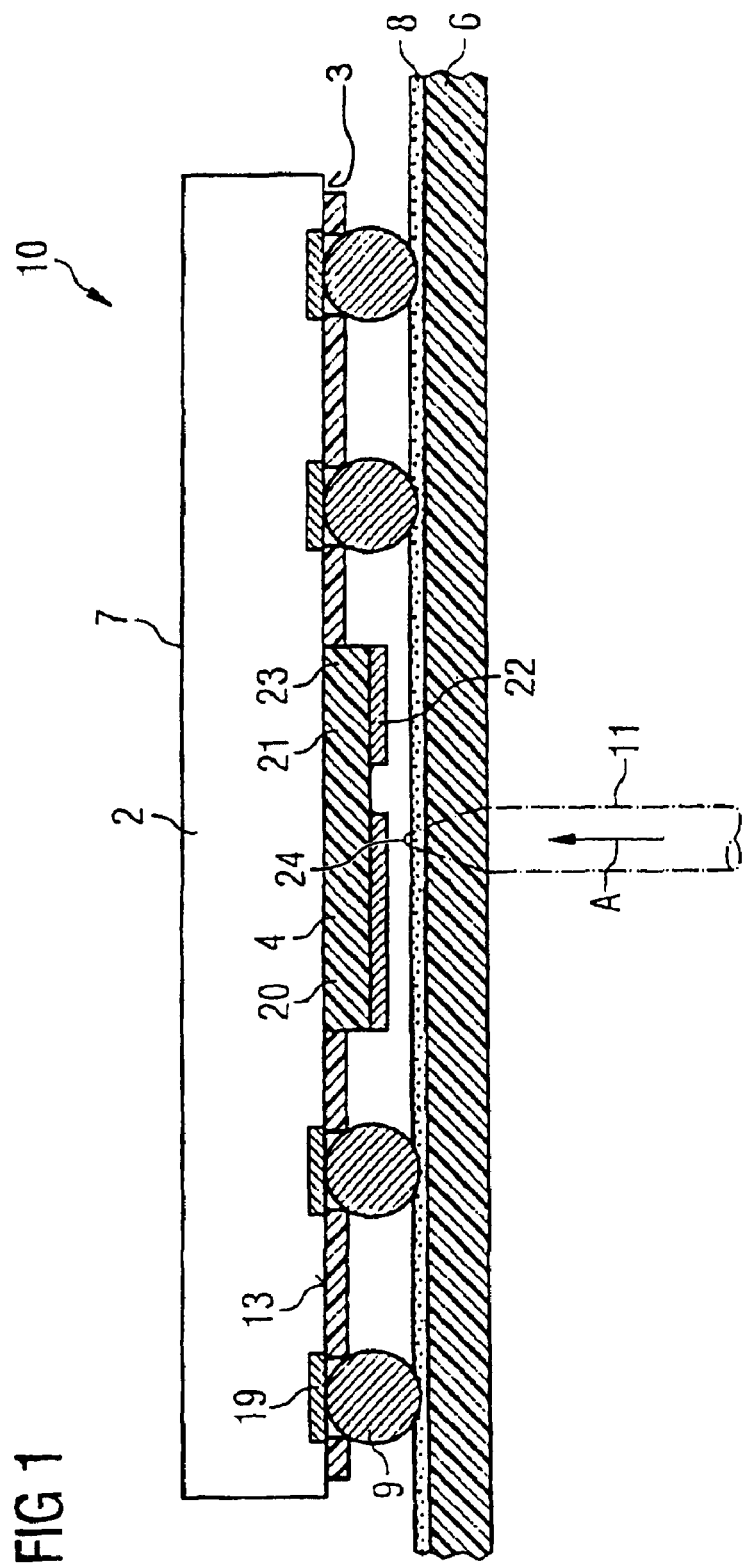
FIG. 1 is a fragmentary, cross-sectional view through a semiconductor chip with semiconductor chip contacts and with a buffer body according to a first embodiment of the invention.

Referring now to the figures of the drawings in detail and first, particularly to FIG. 1 thereof, there is shown a diagrammatic cross-section through a semiconductor chip 2 with semiconductor chip contacts 9 and with a buffer body 4 of a first embodiment of the invention. The semiconductor chip 2 has a passive rear side 7 and an active top side 3. The active top side 3 has uncovered contact areas 19, which, in this embodiment of the invention, carry semiconductor chip contacts 9 configured as solder balls. The semiconductor chip contacts are also called flip-chip contacts and are fixed on a second transport film 6 with an adhesive top side 8. The second transport film 6 serves for transporting semiconductor chips into a lift-off position of a non-illustrated automatic circuit carrier populating machine.

In such a lift-off position 10, as is illustrated in FIG. 1, a piercing tool 11, depicted by broken lines, is used to penetrate through the second transport film 6 and lift the semiconductor chip 2 off from the adhesive top side 8 of the second transport film 6. During the lift-off of the semiconductor chip 2, on account of the buffer body 4 according to the invention, the tip 24 of the piercing tool 11 does not touch the active top side 3 of the semiconductor chip 2 provided with a semiconductor component structure. Rather, the tip 24 strikes a hard metal coating 22 and a layer 20 made of mechanically damping material disposed underneath. This buffer body 4 serves for reliably lifting off the semiconductor chips 2 from the second transport film 6 in the lift-off position 10 at a high cycle frequency and, thus, at a high populating rate of an automatic circuit carrier populating machine without damaging the sensitive active top side 3 of the semiconductor chip 2.

FIGS. 2 to 4 show various embodiments of the buffer body 4 of a semiconductor chip 2 of the present invention.

In FIG. 2, an angular buffer body 4 having a side length of 50 to 500 micrometers and a thickness of between 2 and 50 micrometers is disposed in the area center or centroid 25 of the active top side 3 of the semiconductor chip 2. The buffer body 4 is surrounded by semiconductor chip contacts 9 disposed in rows and columns in the edge region of the active top side 3 of the semiconductor chip 2.

FIG. 3 shows a second embodiment of the invention, in which a circular buffer body 4 is disposed in the area centroid 25 of the active top side 3 of the semiconductor chip 2. The circular buffer body 4 is also surrounded by semiconductor chip contacts 9 in the form of solder balls disposed in rows and columns in the edge region of the active top side 3 of the semiconductor chip 2. The thickness of the buffer body 4 corresponds to the thickness of the buffer body 4 of FIG. 2 and the diameter of the buffer body 4 in FIG. 3 lies between 50 and 500 micrometers.

Semiconductor chips with buffer bodies 4 of the first two embodiments of FIG. 2 and FIG. 3, respectively, are suitable for being used in automatic circuit carrier populating machines in whose lift-off position a non-illustrated individual piercing-out tool is provided for lifting off a semiconductor chip 2 from a second transport film.

FIG. 4 shows a diagrammatic perspective view of a semiconductor chip 2 of a third embodiment of the invention. The difference from the first two embodiments of the invention resides in the fact that no buffer body 4 is provided in the region of the area centroid 25 of the active top side 3 of the semiconductor chip 2, rather that four buffer bodies 4 distributed uniformly in the periphery of the area centroid 25 are provided on the surface 3 of the semiconductor chip 2. In such case, it is necessary, accordingly, to provide four piercing tools in the lift-off position of an automatic circuit carrier populating machine. Such an embodiment of the invention is advantageous when the active top side 3 and the number of semiconductor chip contacts 9 are a multiple with respect to the first two embodiments, in order to relieve the load on the semiconductor chip 2 during lift-off from a second transport film and to prevent micro-crack formations due to increased bending loads.

Figure 5:
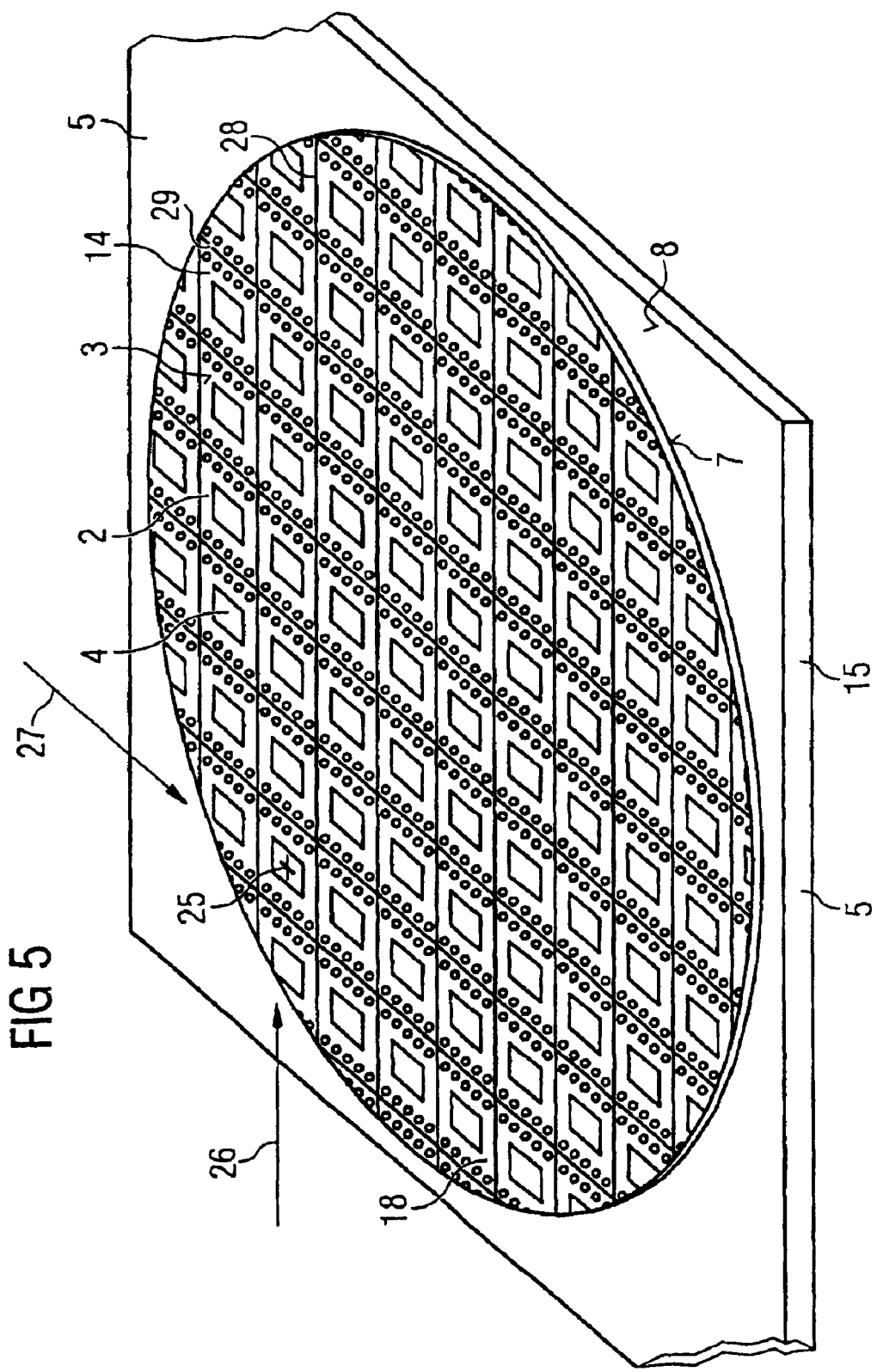
FIG. 5 is a fragmentary, perspective view of a semiconductor wafer according to the invention with a semiconductor chip on a first transport film.

FIG. 5 shows a diagrammatic perspective view of a semiconductor wafer 14 with semiconductor chips 2 on a first transport film 5. The semiconductor wafer 14 exhibits semiconductor chip positions 18 disposed in rows 26 and columns 27. During the production of such a semiconductor wafer 14, firstly, after the completion of the semiconductor-electronic structures, buffer bodies 4 were applied on the active top side 3 in the region of the area centroid 25 of each chip position with the aid of a printing-on method. The external contacts 9 in the form of solder balls are, subsequently, applied on the semiconductor wafer 14. Afterward, the semiconductor wafer 14 on the first transport film 5 can be separated into individual semiconductor chips 2 with buffer body 4 along the horizontal separating lines 28 and the vertical separating lines 29. Because each of the semiconductor chips 2 has to be turned through 180° for further processing of the semiconductor wafer 14, a second transport film is adhesively bonded onto the semiconductor chip contacts 9, the adhesive layer of which has greater adhesion to the semiconductor chip contacts 9 than the first transport film 5 shown in FIG. 5 has to the passive rear side 7 of the semiconductor wafer 14. Consequently, all the semiconductor chips 2 of a wafer 14 are simultaneously turned through 180° and provided for the further processing in an automatic circuit carrier populating machine.

FIGS. 6 to 12 show diagrammatic sketches of method steps for populating a circuit carrier 1 with semiconductor chips 2.

Figure 6:
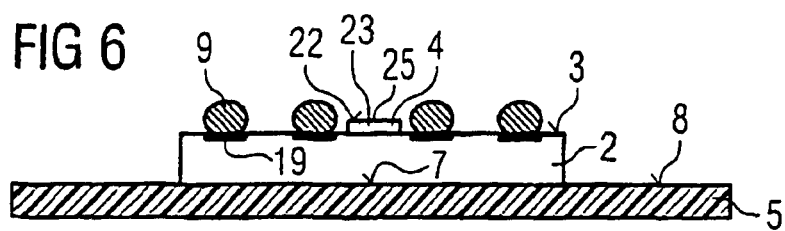
FIG. 6 is a fragmentary, cross-sectional view of a semiconductor chip according to the invention adhesively bonded on a first transport film in a method step for populating a circuit carrier with semiconductor chips according to the invention.

In FIG. 6, a semiconductor chip 2 is disposed on the adhesive top side 8 of a first transport film 5 by its passive rear side 7. In such a configuration, the active top side 3 of the semiconductor chip 2 is disposed above the first transport film 5 and semiconductor chip contacts 9 of the semiconductor chip 2 point away from the first transport film 5. A buffer body 4 is disposed in the area centroid 25 of the active top side 3 between the semiconductor chip contacts 9 in the form of solder balls.

Figure 7:
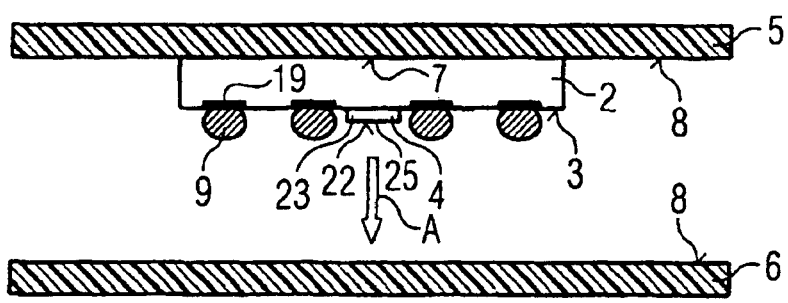
FIGS. 7 to 9 are fragmentary, cross-sectional views of the chip of FIG. 6 illustrating subsequent method steps according to the invention for turning the semiconductor chip with the semiconductor chip being relocated from a first transport film in accordance with FIG. 6 to a second transport film.

In FIG. 7, the first transport film 5 with the semiconductor chip 2 has been turned through 180° relative to FIG. 6. The film 5 is lowered with the semiconductor chip 2 in the direction of arrow A onto a second transport film 6 with an adhesive top side 8.

Figure 8:
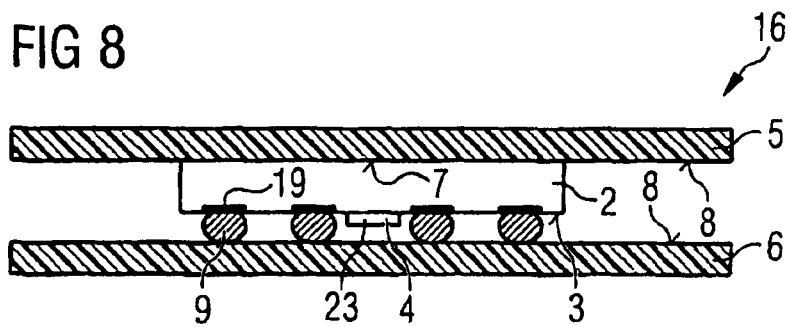

A composite package including the first transport film 5 and the second transport film 6 and the semiconductor chip 2 disposed therebetween can be seen in the cross-section of FIG. 8, the semiconductor chip contacts 9 being fixed on the adhesive top side 8 of the second transport film 6. The force of adhesion between the adhesive top side 8 of the second transport film 6 and the semiconductor chip contacts 9 is significantly greater than the force of adhesion between the passive rear side 7 of the semiconductor chip 2 and the first transport film 5.

Figure 9:
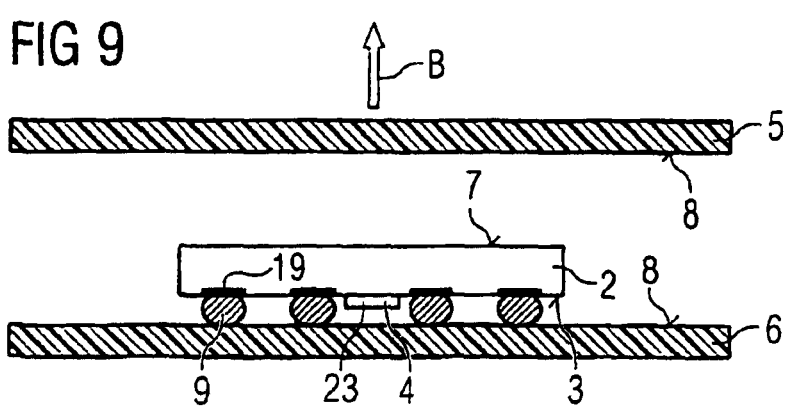

FIG. 9 shows the lifting off of the first transport film 5 in a direction B away from the rear side 7 of the semiconductor chip 2. In such a case, the semiconductor chip 2 with its semiconductor chip contacts 9 is not detached from the second transport film 6.

Figure 10:
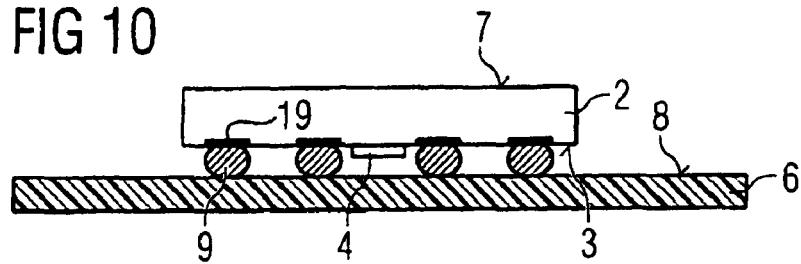
FIG. 10 is a fragmentary, cross-sectional view of the semiconductor chip of FIG. 9 on the second transport film in a subsequent method step.

FIG. 10 shows a diagrammatic sketch of the semiconductor chip 2 after the removal of the first transport film 5 so that the semiconductor chip 2 on the second transport film 6 can be supplied to a lift-off position of an automatic circuit carrier populating machine.

Figure 11:
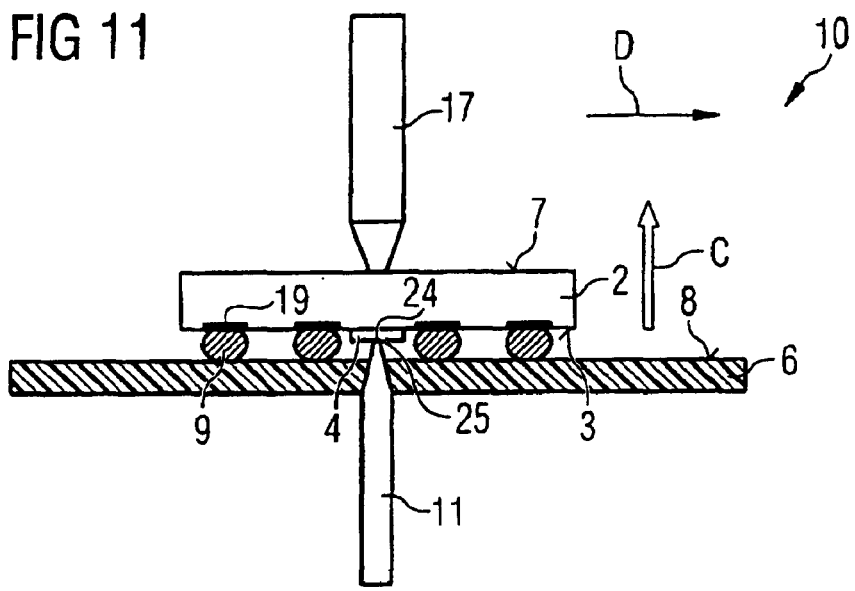
FIG. 11 is a fragmentary, cross-sectional view of a lift-off position of an automatic circuit carrier populating machine together with a component according to the invention in a subsequent method step.

FIG. 11 shows the second transport film 6 in the lift-off position 10 of the automatic circuit carrier populating machine, a piercing tool 11 having pierced through the second transport film 6 in a direction C and lifting off the semiconductor chip 2 in its area centroid 25 from the second transport film 6. The buffer body 4 is disposed in the area centroid 25, the buffer body 4 ensuring that the semiconductor chip 2 is not damaged, and a vacuum forceps 17 takes up the rear side 7 of the semiconductor chip 2 and transports the semiconductor chip 2 in a transport direction D to a placement position.

Figure 12:
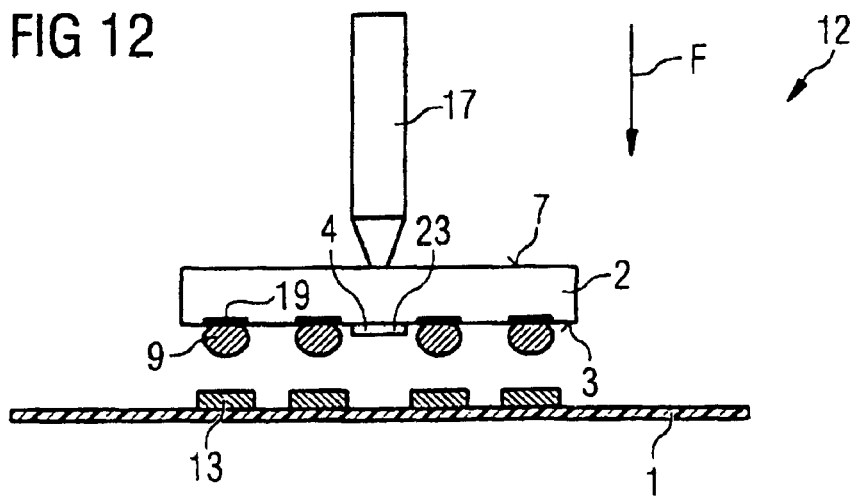
FIG. 12 is a fragmentary, cross-sectional view of a placement position of an automatic circuit carrier populating machine together with a component according to the invention in a subsequent method step.

FIG. 12 shows a diagrammatic sketch of a placement position 12 of an automatic circuit carrier populating machine. Situated in the placement position 12 is a circuit carrier 1 having contact pads 13 of a superordinate circuit or of a rewiring plate. The semiconductor chip 2, which is still held by a vacuum forceps 17, is oriented in the placement position 12 and lowered in a direction F with its semiconductor chip contacts 9 onto the contact pads 13 of the circuit carrier 1. In such a position, already with corresponding preheating of the circuit carrier 1, the semiconductor chip 2 can be soldered onto the contact pads by its semiconductor chip contacts 9 being solder balls. The further production of an electronic component, then, also requires steps that are not illustrated here and that include packaging, for example, of a plurality of semiconductor chips on a circuit carrier 1 in a plastic housing composition, a panel being formed that, after the provision of external contacts, is divided into individual electronic components.

I claim:

1. A semiconductor chip, comprising:
   an active top side;
   semiconductor component structures and contact areas disposed on said active top side;
   a buffer having a protective layer of a mechanically damping material, said protective layer having a free surface, said buffer:
      being disposed between said contact areas arid above said semiconductor component structures; and
      having a hard coating at said free surface of said protective layer, said hard coating forming a free surface of said buffer.

2. The semiconductor chip according to claim 1, wherein said buffer has said coating in areas.

3. The semiconductor chip according to claim 1, wherein said coating includes a hard metal selected from one of the group consisting of a chromium-nickel alloy, an oxide ceramic, and a nitride ceramic.

4. The semiconductor chip according to claim 1, wherein said buffer has a substantially circular contour with a diameter of between approximately 50 and approximately 500 μm and a thickness of between approximately 2 and approximately 50 μm.

5. The semiconductor chip according to claim 1, wherein said buffer has a substantially angular contour with a respective side length of between approximately 50 and approximately 500 μm and a thickness of between approximately 2 and approximately 50 μm.

6. The semiconductor chip according to claim 1, wherein:
said active top side has a centroid; and
said buffer is disposed in a region of said centroid.

7. The semiconductor chip according to claim 1, wherein:
said active top side has a centroid; and
said buffer is a plurality of buffer bodies distributed uniformly around a region of said centroid.

8. A semiconductor chip, comprising:
an active top side;
semiconductor component structures and contact areas disposed on said active top side;
a buffer having a protective layer of a mechanically damping material, said protective layer having a free surfaces said buffer:
being disposed between said contact areas and above said semiconductor component structures; and
having a mechanically protective coating at said free surface of said protective layer, said mechanically protective coating forming a free surface of said buffer.

9. A semiconductor wafer, comprising:
a plurality of semiconductor chips disposed in rows and columns, each of said semiconductor chips having:
an active top side;
semiconductor component structures and contact areas disposed on said active top side;
a buffer having a protective layer of a mechanically damping material, said protective layer having a free surface, said buffer:
being disposed between said contact areas and above said semiconductor component structures; and
having a hard coating at said free surface of said protective layer, said hard coating forming a free surface of said buffer.

10. A method for producing a semiconductor wafer, which comprises:
forming semiconductor component structures and contact areas in rows and columns on an active top side of a semiconductor chip;
providing a buffer having a protective layer of a mechanically damping material with a free surface and a hard coating at the free surface of the protective layer, the hard coating forming a free surface of the buffer; and
applying the buffer between the contact areas and to above the semiconductor component structures.

11. A method for producing a semiconductor wafer, which comprises:
forming semiconductor component structures and contact areas in rows and columns on an active top side of the semiconductor wafer;
providing a buffer having a protective layer of a mechanically damping material with a free surface and a mechanically protective coating at the free surface of the protective layer, the mechanically protective coating forming a free surface of the buffer; and
applying the buffer between the contact areas and above the semiconductor component structures.

12. A method for producing a semiconductor chip, which comprises:
forming semiconductor component structures and contact areas on an active top side of the semiconductor chip;
providing a buffer having a protective layer of a mechanically damping material with a free surface and a hard coating at the free surface of the protective layer, the hard coating forming a free surface of the buffer; and
applying the buffer between the contact areas and above the semiconductor component structures.

13. A method for producing a semiconductor chip, which comprises:
forming semiconductor component structures and contact areas on an active top side of the semiconductor chip;
providing a buffer having a protective layer of a mechanically damping material with a free surface and a mechanically protective coating at the free surface of the protective layer, the mechanically protective coating forming a free surface of the buffer; and
applying the buffer between the contact areas and above the semiconductor component structures.

14. The method according to claim 10, which further comprises carrying out the application step by:
applying a layer of a mechanically damping material; and
subsequently patterning the damping material layer to form buffer bodies in semiconductor chip positions by one of:
photolithography and etching; and
laser removal.

15. The method according to claim 14, which further comprises providing the damping material layer as a plastic layer.

16. The method according to claim 12, which further comprises carrying out the application step by:
applying a layer of a mechanically damping material; and
subsequently patterning the damping material layer to form buffer bodies in semiconductor chip positions by one of:
photolithography and etching; and
laser removal.

17. The method according to claim 16, which further comprises providing the damping material layer as a plastic layer.

18. The method according to claim 14, which further comprises carrying out the step of applying the buffer bodies in the semiconductor chip positions by printing the damping material layer thereon by one of jet printing technology, screen printing technology, and mask printing technology.

19. The method according to claim 16, which further comprises carrying out the step of applying the buffer bodies in the semiconductor chip positions by printing the damping material layer thereon by one of jet printing technology, screen printing technology, and mask printing technology.

20. The method according to claim 10, which further comprises carrying out the applying step by applying a multilayer coating to the semiconductor wafer and subsequently patterning the coating to form buffer bodies.

21. The method according to claim 14, which further comprises carrying out the applying step by applying a multilayer coating to the semiconductor wafer and subsequently patterning the coating to form buffer bodies.

22. The method according to claim 18, which further comprises carrying out the applying step by applying a multilayer coating to the semiconductor wafer and subsequently patterning the coating to form buffer bodies.

23. A method for mounting semiconductor chips on supports, which comprises:
providing semiconductor chips with active top sides and passive rear sides;
forming semiconductor component structures and contact areas on the active top sides;
providing a buffer with a protective layer of a mechanically damping material, the protective layer having a free surface, and with a hard coating at the free surface of the protective layer, the hard coating forming a free surface of the buffer;

forming the buffer between the contact areas and above the semiconductor component structures;

mounting the semiconductor chips on circuit carriers by:

providing a first transport film with an adhesive top side having a given adhesive strength;

adhesively bonding the semiconductor chips by their passive rear sides on the adhesive top side;

providing a second transport film with an adhesive strength greater than the given adhesive strength;

applying the second transport film to the active top side of the semiconductor chips;

removing the first transport film from the passive rear sides of the semiconductor chips;

supplying the semiconductor chips on the second transport film to a circuit carrier populating device;

successively lifting off the semiconductor chips from the second transport film in the populating device at a lift-off position by at least one piercing tool penetrating through the second transport film and acting on the buffer disposed on the semiconductor chip; and positioning the semiconductor chips with the semiconductor chip contacts onto corresponding contact pads of the circuit carrier.

24. The method according to claim 23, which further comprises turning the first transport film with the semiconductor chips through 180° before applying the second transport film.

25. The method according to claim 23, which further comprises turning a composite including the first transport film, the second transport film, and the semiconductor chips disposed between the first and second transport films through 180° before removing the first transport film from the passive rear sides of the semiconductor chips.

* * * * *

UNITED STATES PATENT AND TRADEMARK OFFICE
CERTIFICATE OF CORRECTION

PATENT NO. : 6,906,428 B2
DATED : June 14, 2005
INVENTOR(S) : Rudolf Lehner

It is certified that error appears in the above-identified patent and that said Letters Patent is hereby corrected as shown below:

Column 10,
Line 50, should read as follows:
-- being disposed between said contact areas and above --.

Column 11,
Line 17, should read as follows:
-- surface, said buffer: --.
Line 47, should read as follows:
-- applying the buffer between the contact areas and above --.

Signed and Sealed this

Sixth Day of September, 2005

JON W. DUDAS
*Director of the United States Patent and Trademark Office*